United States Patent [19]
Haddad

[11] Patent Number: 5,790,456
[45] Date of Patent: Aug. 4, 1998

[54] MULTIPLE BITS-PER-CELL FLASH EEPROM MEMORY CELLS WITH WIDE PROGRAM AND ERASE $V_T$ WINDOW

[75] Inventor: Sameer S. Haddad, San Jose, Calif.

[73] Assignee: Advanced Micro Devices, Inc., Sunnyvale, Calif.

[21] Appl. No.: 853,185

[22] Filed: May 9, 1997

[51] Int. Cl.[6] .................................................. G11C 16/04
[52] U.S. Cl. ........................ 365/185.17; 365/185.18; 365/185.28
[58] Field of Search ................ 365/185.02, 185.18, 365/185.28, 185.17

[56] References Cited

U.S. PATENT DOCUMENTS

| | | | |
|---|---|---|---|
| 5,245,570 | 9/1993 | Fazio et al. | 365/185.13 |
| 5,555,521 | 9/1997 | Hamada et al. | 365/185.03 |
| 5,625,600 | 4/1997 | Hong | 365/218 |
| 5,638,327 | 6/1997 | Dallabora et al. | 365/185.33 |

Primary Examiner—David C. Nelms
Assistant Examiner—Hoai Ho
Attorney, Agent, or Firm—Davis Chin

[57] ABSTRACT

There is provided an improved method for performing channel hot-carrier programming in an array of multiple bits-per-cell Flash EEPROM memory cells in a NOR memory architecture so as to eliminate program disturb during a programming operation. The array has a plurality of memory cells arranged in rows of word lines and columns of bit lines intersecting the rows of word lines. A programming current source is connected to the source of selected memory cells that are to be programmed in the corresponding columns of bit lines. A programming gate voltage is applied to control gates of the selected memory cells, and a programming drain voltage is applied simultaneously to the common array ground line connected to the drains of all of the memory cells. Further, a relatively low voltage is applied simultaneously to all of the control gates of non-selected memory cells in the array which are not to be programmed during the programming operation so as to eliminate the program disturb.

10 Claims, 4 Drawing Sheets

MULTIPLE BITS-PER-CELL FLASH EEPROM MEMORY CELLS WITH WIDE PROGRAM AND ERASE $V_T$ WINDOW

BACKGROUND OF THE INVENTION

1. Field of the Invention

This invention relates generally to floating gate memory devices such as an array of Flash electrically, erasable programmable read-only memory (EEPROM) cells. More particularly, it relates to an improved programming method used for multiple bits-per-cell Flash memory cells for performing channel hot-carrier programming in a NOR memory architecture so as to eliminate program disturb during a programming operation.

2. Description of the Prior Art

As is generally known in the art, a new category of electrically erasable EPROMs/EEPROMs has emerged in recent years as an important non-volatile memory which combines the advantages of EPROM density with EEPROM electrical erasability and is sometimes referred to as "Flash" EPROM or EEPROM. Such Flash EEPROMs provide electrical erasing and a small cell size. One type of architecture used for Flash memories is typically referred to as a NOR Flash memory architecture which is an array of Flash EEPROM memory cells (floating gate devices) arranged in rows of word lines and columns of bit lines intersecting the rows of word lines so as to form a matrix. Each of the memory cells is formed of a corresponding one of array floating gate transistors. In particular, the memory cell transistors that are arranged in the same row have their selection terminals (e.g., control gates) connected to a common word line. Further, the memory cell transistors that are arranged in the same column have their sources connected to a corresponding one of the columns of bit lines. Also, the memory cell transistors arranged in the same row have their drains connected to a common array ground line VSS.

Such a NOR Flash memory architecture is illustrated and described in co-pending application Ser. No. 08/635,995 filed on Apr. 22, 1996, and entitled "A Method for Flash EEPROM Page Mode Programming Multiple Bits-Per-Cell." This Ser. No. 08/635,995 is assigned to the same assignee as the present invention and is hereby incorporated in its entirety by reference. In FIG. 3 of Ser. No. 08/635,995, there is shown a Flash EEPROM memory core cell array 12. During the sector programming mode of operation, a relatively high positive voltage (e.g., +12 V) is applied to the control gates via word lines of the selected memory cells and zero volts are applied to the control gates via word lines of the non-selected memory cells. Further, the sources of the memory cell transistors connected to the same bit line having a selected memory cell (memory cell that is to be programmed) is connected to a current source circuitry in which the current source $I_s$ thereof is turned on, and the drains thereof connected to the common array ground line VSS are applied with a programming drain voltage VPROG of approximately 6–7 volts.

However, since the drains of the unselected memory cell transistors are also supplied with the programming drain voltage VPROG of 6–7 volts, the contents of the unselected memory cell transistors in the same column as the selected memory cell transistor may be disturbed. In other words, the charge on the floating gates thereof may be disturbed which is sometimes referred to as "program disturb." Therefore, the problem of program disturb is of a major concern for a multiple bits-per-cell Flash memory array optimized for utilizing channel hot-carrier programming. The reason for this is that the channel and the drain junction of the memory cell transistors are generally doped so as to improve the efficiency of hotelectron injection. As a result, there is created an enhanced corner electric field which is the cause for the problem of program disturb. Moreover, some of the holes and electrons which are generated by the band-to-band tunnelling current will be injected onto the floating gate of the unselected memory cell transistors dependent upon the vertical field. Thus, when a particular memory cell is selected for programming, the other unselected memory cells connected to the same bit line will be disturbed by the high corner electric field.

In co-pending application Ser. No. 08/493,138 filed on Jun. 21, 1995, which matured into U.S. Pat. No. 5,590,076 issued Dec. 31, 1996, to Sameer S. Haddad et al. and entitled "Channel Hot-Carrier Page Write," there is disclosed a EEPROM memory which has a stacked gate cell architecture and relies upon drain-side injection of hot carriers for programming at low drain current levels, thereby permitting charge pump programming of at least 1,024 memory cells with an increased writing speed. This Ser. No. 08/493,138 is also incorporated herein by reference, which is assigned to the same assignee as the present invention.

Therefore, it would be desirable to provide an improved programming method for performing channel hot-carrier programming in a NOR memory architecture which eliminates program disturb during a programming operation. Further, it would be expedient to provide a multiple bits-per-cell NOR memory array architecture using channel hot-carrier programming which produces a wider program and erase VT window. The present invention represents a significant improvement over the aforementioned Ser. Nos. 08/635,995 and 08/493,138. This is achieved by applying a relatively low voltage to all of the control gates of non-selected memory cells in the array which are not to be programmed during the programming operation.

SUMMARY OF THE INVENTION

Accordingly, it is a general object of the present invention to provide an improved programming method used for multiple bits-per-cell Flash memory cells for performing channel hot-carrier programming in a NOR memory architecture which overcomes the disadvantages of the prior art programming methods.

It is an object of the present invention to provide an improved programming method in a NOR memory architecture which relies upon channel hot-injection of hot carriers for programming at low drain current levels and which eliminates program disturb during the programming operation.

It is another object of the present invention to provide an improved programming method for performing channel hot-carrier programming in a NOR memory architecture which produces a wider program and erase $V_T$ window.

It is still another object of the present invention to provide an improved programming method for performing channel hot-carrier programming in a NOR memory architecture which requires a smaller programming current and has a relatively fast programming time than those traditionally available.

In a preferred embodiment of the present invention, there is provided an improved method for performing channel hot-carrier programming in an array of multiple bits-per-cell Flash EEPROM memory cells in a NOR memory architecture so as to eliminate program disturb during a programming operation. The array includes a plurality of memory cells arranged in rows of word lines and columns of bit lines intersecting the rows of word lines. Each of the memory cells includes a floating gate transistor having its control gate connected to one of the rows of word lines, its source connected to ones of the columns of bit lines, and its drain connected to a common array ground line.

This improved programming method is accomplished by connecting a programming current source to the source of selected memory cells that are to be programmed in the corresponding columns of bit lines. Simultaneously, there is applied a programming gate voltage to the control gates of the selected memory cells. Also, there is applied a programming drain voltage to the common array ground line connected to the drains of all of the memory cells. Further, a relatively low voltage is applied simultaneously to all of the control gates of non-selected memory cells in the array which are not to be programmed during the programming operation so as to eliminate the program disturb.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
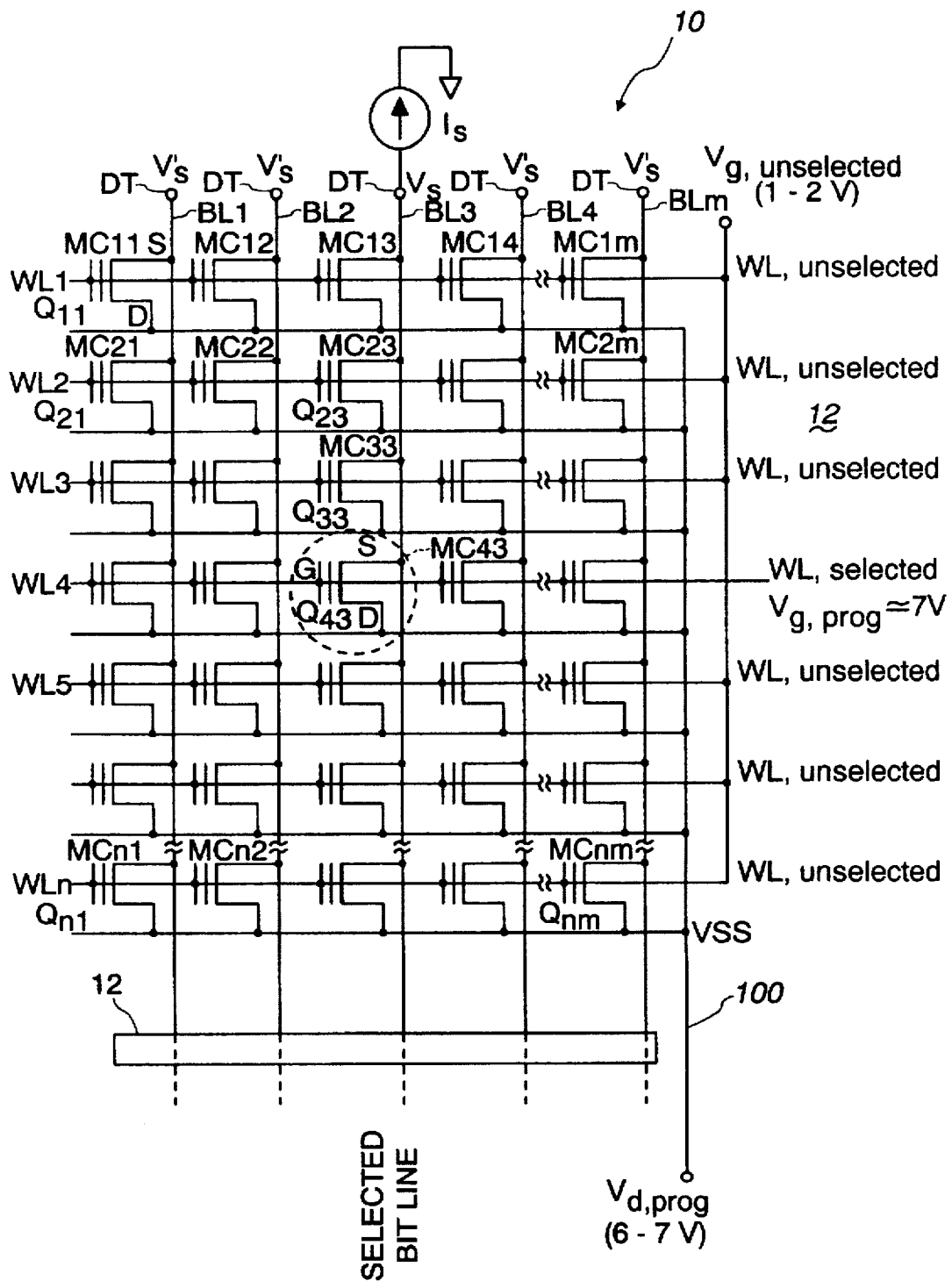
FIG. 1 is a schematic circuit diagram of a NOR Flash memory architecture employing the programming method of the present invention.
Figure 3:
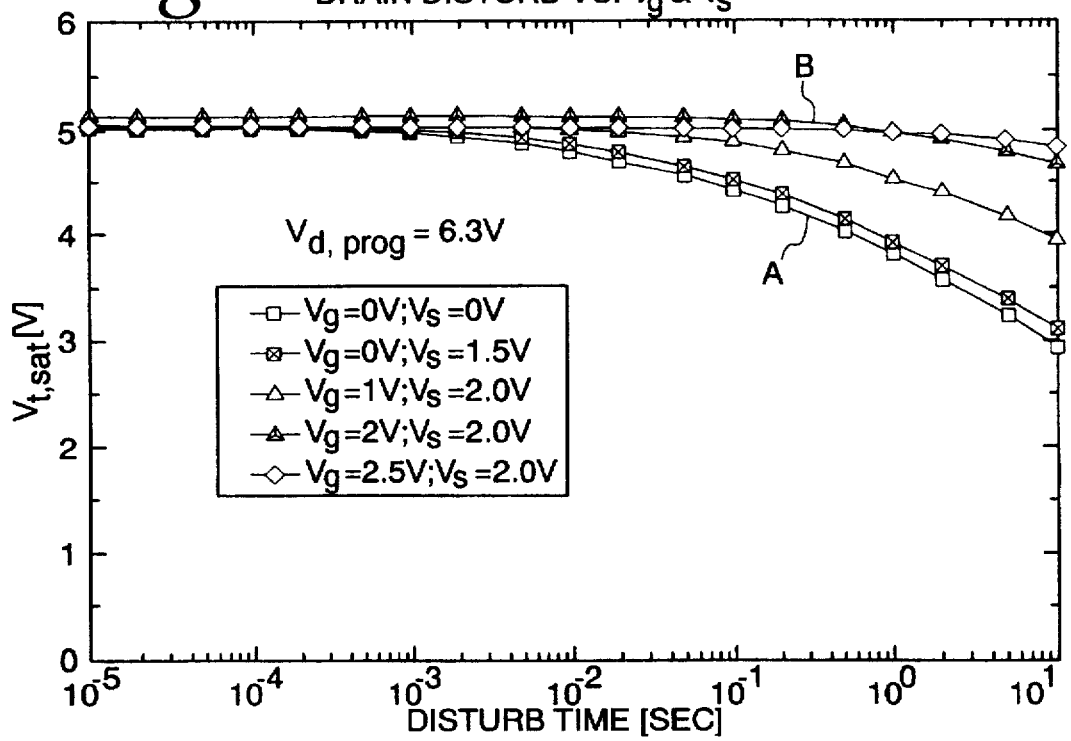
FIG. 3 illustrates the program disturb as measured by the threshold voltage $V_t$ of unselected programmed cells as a function of time for various gate and source voltages per the inset with a fixed programming drain voltage.

Referring now in detail to the drawings, there is illustrated in FIG. 1 a schematic circuit diagram of a conventional NOR Flash memory architecture 10 which has the same memory core array structure as illustrated in FIG. 3 of the aforementioned Ser. No. 08/635,995 in which the improved programming method for performing channel hot-carrier programming for multiple bits-percell Flash memory cells so as to eliminate program disturb during a programming operation can be employed according to the principles of the present invention. The NOR Flash memory architecture 10 includes an array sector 12 having a plurality of Flash electrically erasable and programmable read-only memory (EEPROM) cells MC11 through MCnm arranged in rows of word lines WL1, WL2, . . . WLn and columns of bit lines BL1, BL2, . . . BLm intersection the rows of word lines so as to form the sector.

It is to be distinctly understood that the array sector 12 represents only one of a large number of identical sectors provided on a single integrated circuit memory chip. As a specific example of a 16 Mb NOR memory architecture, the memory cells are arranged in a matrix pattern of $2^{14}$ rows and $2^{10}$ columns. A predetermined number of rows may be grouped together so as to form a sector. In this preferred embodiment, the NOR memory architecture 10 consists of 32 sectors with each sector containing 512 rows. Alternatively, the 16 Mb NOR memory architecture may be formed of $2^{12}$ rows and $2^{12}$ columns. A certain number of the $2^{12}$ columns may be grouped together to form a page. For instance, the $2^{12}$ columns may be divided into four pages so that each page will contain 1,024 bits. In this case, there would only be 8 sectors with each sector again containing 512 rows.

As can be seen from FIG. 1, the memory core cells MC11, MC12, . . . MC1m are arranged in the same row and have their selection terminals connected to the same common word line WL1. Similarly, the memory core cells MC21, MC22, . . . MC2m are arranged in the same row and have their selection terminals connected to the same common word line WL2. This is likewise the case for each of the remaining rows in WL3 . . . WLn in the array sector 12. Thus, the memory cells MCn1, MCn2, . . . MCnm arranged in the same row have their selection terminals connected to the same common word line WLn. Further, the core cells MC11, MC21, . . . MCn1; the core cells MC21, MC22, . . . MCn2; and the core cells MC1m, MC2m, . . . MCnm are arranged in the same respective columns and have their corresponding data terminals connected to associated common bit lines BL1, BL2, . . . BLm, respectively. In the present example, the number n is equal to 512 for each sector and the number m is equal to 1,024.

Each of the memory core cells MC11 through MCnm is comprised of one of the corresponding floating gate transistors $Q_{11}$–$Q_{nm}$. The floating gate transistors $Q_{11}$–$Q_{nm}$ serve as a memory transistor for storing data or logic levels therein. Each of the floating gate transistors has its gate connected to one of the rows of word lines WL1 . . . WLn, its source S connected to one of the columns of bit lines BL1 . . . BLm, and its drain D connected to a sector common array ground line VSS.

As is well known in the art, each of the transistors $Q_{11}$–$Q_{nm}$ utilizes a floating polysilicon layer referred to as a floating gate which is positioned above and insulated from a channel region by a thin gate dielectric. The channel region is formed between the source and drain regions. A polysilicon control gate is insulatively supported above the floating gate by an interpoly dielectric layer. The floating gate is used to retain charges, thereby varying the threshold voltage of the transistor. This threshold voltage is the minimum voltage applied to the control gate which is needed in order to turn on the transistor, i.e., causing current to flow between the source and drain regions. In the "ON" state, the channel is conducting and current flows between the source and drain regions. In the "OFF" state, the channel is not conducting and no current flows between the source and drain regions. As used herein, the term "programming" refers to charging or placing of negative charges (electrons) on the floating gate. The term "erasing" refers to discharging or extracting of negative charges from the floating gate.

During normal programming operation, a relatively high positive voltage (on the order of +6–7 volts for a 3 V Flash EEPROM array) is applied to the control gate via the word line (e.g., WL4) containing the selected memory cell and zero volts are applied to the control gates via the word lines (e.g., WL1–WL3 and WL5–WLn) of the non-selected memory cells. Further, the source S of the memory cell transistor $Q_{43}$ connected to the bit line BL3 is connected to a current source $I_s$ which is turned on, and the drain D thereof connected to the common ground line VSS is applied with a programming drain voltage $V_{d,prog}$ of approximately +6–7 volts. The current source $I_s$ has its one end connected to a data terminal DT and its other end connected to a ground potential. A source pull-up voltage $V_s$ can be measured at the data terminal DT when the current source is turned on.

It should be noted that the non-selected bit lines BL1, BL2 and BL4 ... BLn are all pre-charged to a voltage $V'_s$ via the data terminal DT, which is approximately equal to the programming drain voltage $V_{d,prog}$. In this manner, the floating gate of the selected memory cell transistor $Q_{43}$ will be charged with electrons. While the source pull-up voltage $V_s$ at the data terminal connected to the selected bit line BL3 will be decreasing so as to create a sufficient drain-to-source voltage $V_{DS}$ across the transistor $Q_{43}$ causing programming, the threshold voltage as seen at the control gate will be made positive. However, a problem is created since all of the remaining drains of the unselected memory core transistors in the same column as the selected memory core transistor are also supplied with the programming drain voltage $V_{d,prog}$ of +6–7 volts via line 100. Therefore, the contents of the unselected memory core transistors (e.g., $Q_{13}$–$Q_{33}$ and $Q_{53}$–$Q_{n3}$) may be disturbed.

In other words, when the memory cell transistor $Q_{43}$ is being selected for programming by applying 6–7 volts to its word line WL4 and by applying the programming drain voltage $V_{d,prog}$ to its drain, other memory cell transistors connected to the same column or bit line (i.e., BL3) but not selected for programming (since their word line is at zero volts) may be nevertheless affected by the programming operation on the selected memory cell transistor $Q_{43}$ due to the programming drain voltage $V_{d,prog}$ applied to the line 100 connected to the common array ground line VSS. This may induce electric charge leakage in the unselected memory cell transistors, resulting in either a gain or loss of electric charge on their floating gates. For an unselected memory cell which has been previously programmed, the term "program disturb" means that there is a discharging of electrons from the floating gate or erasing. For an unselected memory cell which has been previously erased, the term "program disturb" means that there is a charging of electrons onto its floating gate or programming. The effect of "program disturb" is to create soft errors by shifting the threshold voltage levels of the other memory cell transistors $Q_{13}$–$Q_{33}$ and $Q_{53}$–$Q_{n3}$, connected to the same bit line but not being programmed.

Assume that the memory cell MC23 formed by the transistor $Q_{23}$ was previously programmed and that the memory cell MC33 formed by the transistor $Q_{33}$ was previously erased. Then, during programming of the selected memory cell MC43 formed by the transistor $Q_{43}$, the programmed memory cell MC23 having a relatively high threshold voltage will be reduced to a lower value. The erased memory cell MC33 having a relatively low threshold voltage will be raised to a higher value. Accordingly, when it comes time to program and erase the memory cells MC23 and MC33, their programmability and erasability will have been degraded.

Before describing in detail the improved programming method used for multiple bits-per-cell Flash memory cells for performing channel hot-carrier programming in a NOR memory architecture according to the present invention, it is believed that it would be helpful in understanding the principles of the instant invention and to serve as a background by explaining initially the investigations conducted and the results of the experimental data observed by the inventor.

Figure 2:
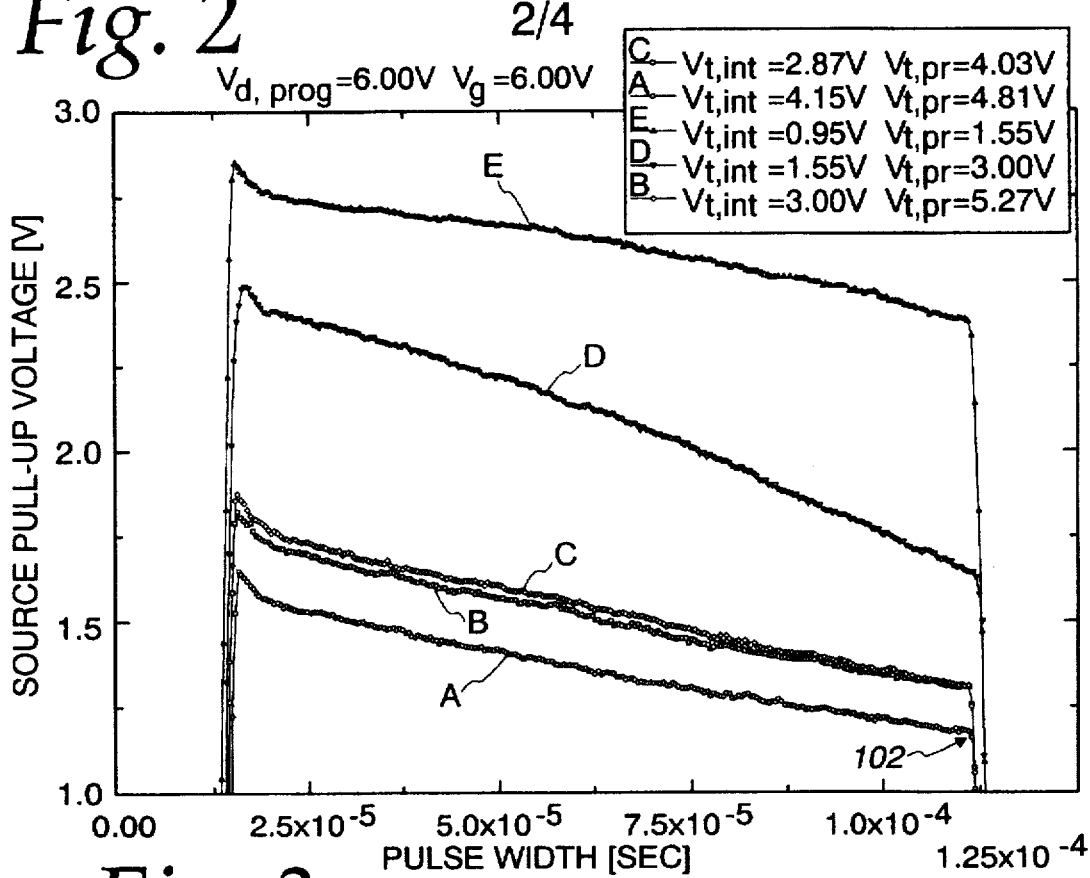
FIG. 2 shows the source pull-up voltage $V'_s$ of the selected bit lines during programming as a function of the different initial threshold voltages $V_{t,int}$ per the inset with a fixed programming drain voltage $V_{d,prog}$ and gate voltage $V_g$.

In FIG. 2, the source pull-up voltage $V'_s$ of the selected bit line in the circuit of FIG. 1 during programming is plotted for different initial threshold voltages $V_{t,int}$ per the inset. The programming drain voltage $V_{d,prog}$ of +6 V is applied to the line 100 connected to the common array ground line VSS, and the selected word line WL4 has applied thereto also a programming gate voltage of +6 V. The current source $I_s$ is set to equal approximately 3 µA. As can be observed, the higher initial threshold voltage $V_{t,int}$ will have a lower source pull-up voltage $V'_s$ which results in a larger drain-to-source voltage across the channel. Consequently, the hot-carrier effect is increased, and the programming efficiency is improved. Thus, this infers that the programming speed depends upon the initial threshold voltage $V_{t,int}$. The inset provides the information on the initial threshold voltage $V_{t,int}$ before a programming pulse is applied and the threshold voltage $V_{t,pr}$ after the pulse is applied.

FIG. 3 illustrates the program disturb as measured by the threshold voltage $V_t$ of the unselected programmed cell as a function of time for the various gate and source voltages per the inset. The programming voltage $V_{d,prog}$ applied to the line 100 connected to the common array ground line VSS is set equal to +6.3 V. The values of the bit line voltages $V_s$ are selected to simulate the source pull-up voltage at the end of programming. It will be observed that the worst case for the program disturb is when the bit line voltage $V_s$ of the selected column is set equal to approximately $V_s$=0 V and the gate voltage of the selected word line is set equal to approximately 0 V (see curve A of FIG. 3).

As will be recalled from FIG. 2, the minimum source voltage corresponds to the maximum programmed threshold voltage $V_{t,pr}$. Therefore, for the programmed threshold voltage $V_{t,pr}$ being close to ~5 V, the source pull-up voltage is approximately equal to 1.25 V after the pulse has been applied (at point 102 in curve A of FIG. 2). The best program disturb characteristics were obtained when the bit line voltage $V_s$ of the selected column is set equal to approximately $V_s$=2.0 V, and the gate voltage of the selected word line is set equal to approximately 2.5 V (curve B of FIG. 3). By comparing the curves A and B in FIG. 3, it will be noted that there is obtained approximately 3 orders of magnitude improvement in the disturb time (e.g., $10^{-2}$ seconds to $10^1$ seconds) by applying a relatively low gate voltage of +2.5 V. As a result, there has been demonstrated the dependance of the program disturb on the voltage applied to the gates of the unselected memory cell transistors.

For the unselected programmed cells (unselected memory cells that were previously programmed, such as MC23 in FIG. 1), the application of $V_g$=+2 V functions to reduce the vertical field. As a consequence, the band-to-band tunneling current across the drain-substrate junction will be reduced and thus prevents program disturb. As the tunnel oxide layer is being made thinner in view of lower power supply voltages, the Fowler-Norheim tunneling current will become sufficiently significant so as to cause "program disturb" (erasing) on the unselected programmed cells. Since the drain voltage of approximately +6 V is also applied on the drains of the unselected programmed cells, this will produce a sufficiently high vertical field (oxide field) so as to discharge the unselected program cell MC23. Thus, if a low gate voltage is applied to the word line WL2 then the oxide field will be proportionally reduced which will inhibit the discharging of the programmed cell MC23.

On the other hand, for the unselected erased cells (unselected memory cells that were previously erased, such as MC33), the mechanism for causing "program disturb" is channel hot carrier programming. In order for the generation of hot carriers for soft programming the memory cell must be turned "ON." The application of $V_g=+2$ V to its gate via the word line WL3 serves to increase the vertical field and therefore enhances the soft programming. However, in this application the source is biased always at a voltage of +1.5 V or higher which keeps the erased cells with a threshold voltage $V_t$ of 1 V or higher in the "OFF" state. The reason for this is because of the reduction in the gate drive $V_{gs}$ (the difference between the voltage applied to its control gate and its source) which is a function of the capacitive couplings between the floating gate and the control gate, the floating gate and the source, and the floating gate and the drain. It should also be noted that the source voltage will apply an increased effective back-bias to the substrate which will, in turn, increase the effective threshold voltage $V_t$ of the erased cells due to the body factor.

Figure 4:
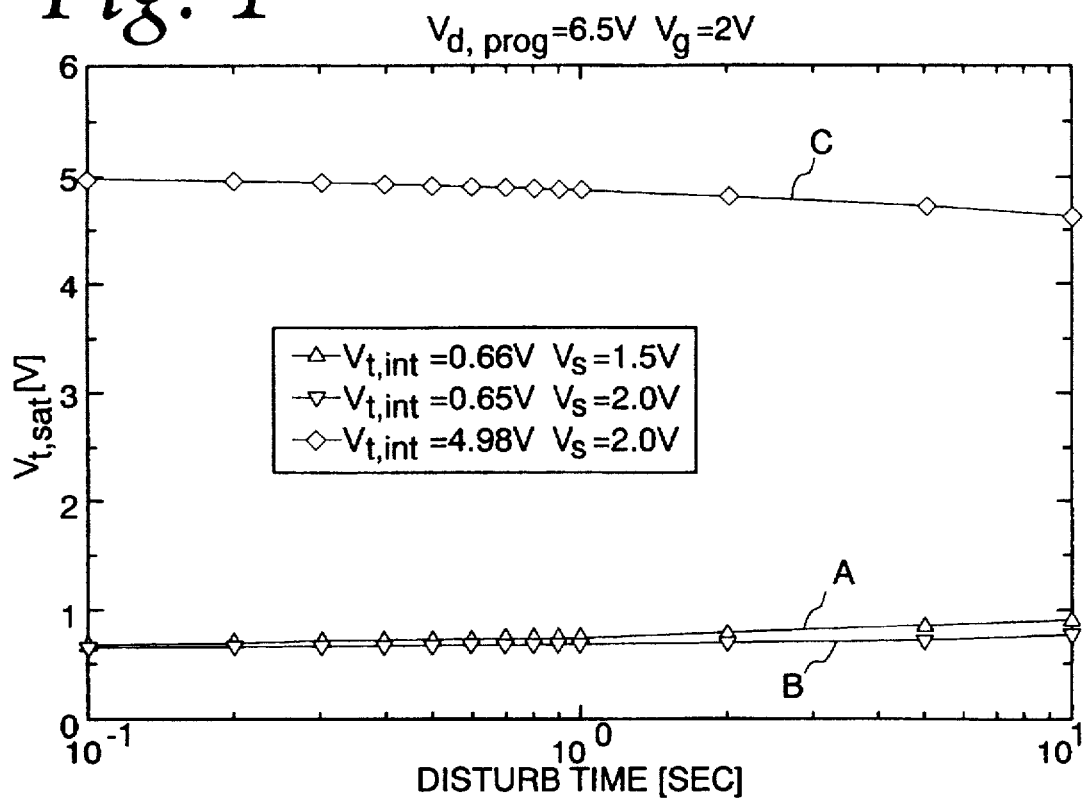
FIG. 4 shows the program disturb as measured by the threshold voltage $V_t$ for various initial threshold voltages and source voltages per the inset with fixed programming drain and gate voltages.

In FIG. 4, the program disturb as measured by the threshold voltage $V_t$ of the unselected cell is plotted as a function of time for different initial threshold voltages $V_{t,int}$ and source voltages per the inset. The programming drain voltage $V_{d,prog}$ is set equal to +6 V, and the gate voltage applied to the unselected cells is set equal to +2.0 V. As can be seen from the curve A, there is illustrated soft programming when the bit line voltage $V_s$ is set equal to 1.5 V. Under this condition, the drain-to-source voltage will be larger than when the bit line voltage is set equal to +2 V (see curve B). It is significant to note that after the disturb time of 10 seconds there is still achieved a better than 4 volts operating window over the condition $V_{t,int}=4.98$ V and $V_s=2.0$ V (curve C).

Figure 5:
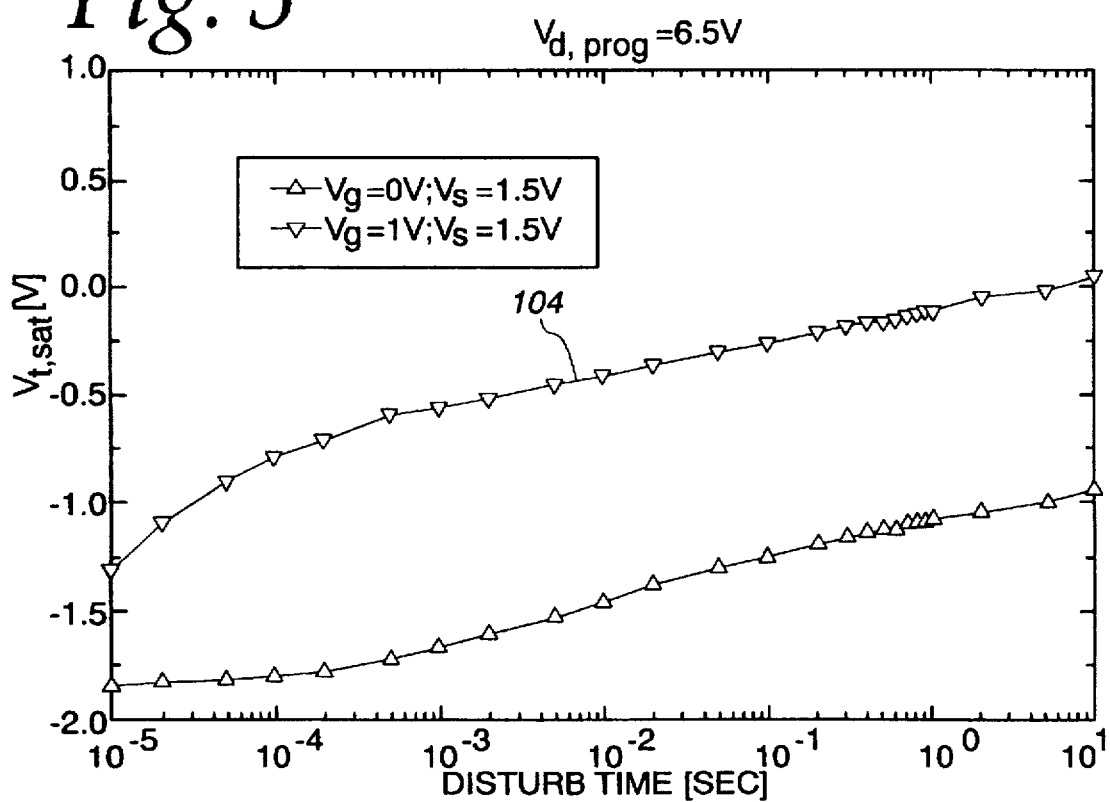
FIG. 5 illustrates the program disturb of the threshold voltage of the unselected erased cell as a function of time for various gate and source voltages per the inset with a fixed programming drain voltage.

In order to further demonstrate the soft programming dependence on the gate voltage applied to the unselected cells, there is plotted in FIG. 5 the program disturb as measured by the threshold voltage $V_t$ of the unselected program cell as a function of time for different gate voltages per the inset. Again, the programming drain voltage $V_{d,prog}$ applied to the line 100 connected to the common array ground line VSS was set equal to +6.5 V. As can be seen, a small gate voltage of +1 V will cause a fast soft programming of the unselected cell (curve 104). This experimental data indicates that a low gate voltage may be used in a separate pre-programming cycle or step in order to program back any over-erased cells.

It should be clearly understood that this pre-programming step is equally applicable to a conventional NOR memory architecture in which a memory array sector has a plurality of memory cells arranged in rows of wordlines and columns of bit lines intersecting the rows of wordlines, each of the memory cells being formed of a floating gate transistor having its control gate connected to one of the rows of wordlines, its drain connected to one of the columns of bit lines, and its source connected to a common source line. In order to program the memory cells in the conventional NOR memory architecture in a typical operation, the drains of the selected memory cells connected to the selected columns of bit lines are raised to a moderately high voltage such as +5.5 volts. The control gates of the selected memory cells have applied thereto a relatively high voltage such as approximately +12 volts. All of the sources of the memory cells are connected to a ground potential via the common source line. Such programming of the conventional NOR memory architecture is illustrated and described in the aforementioned '076 patent.

Figure 6:
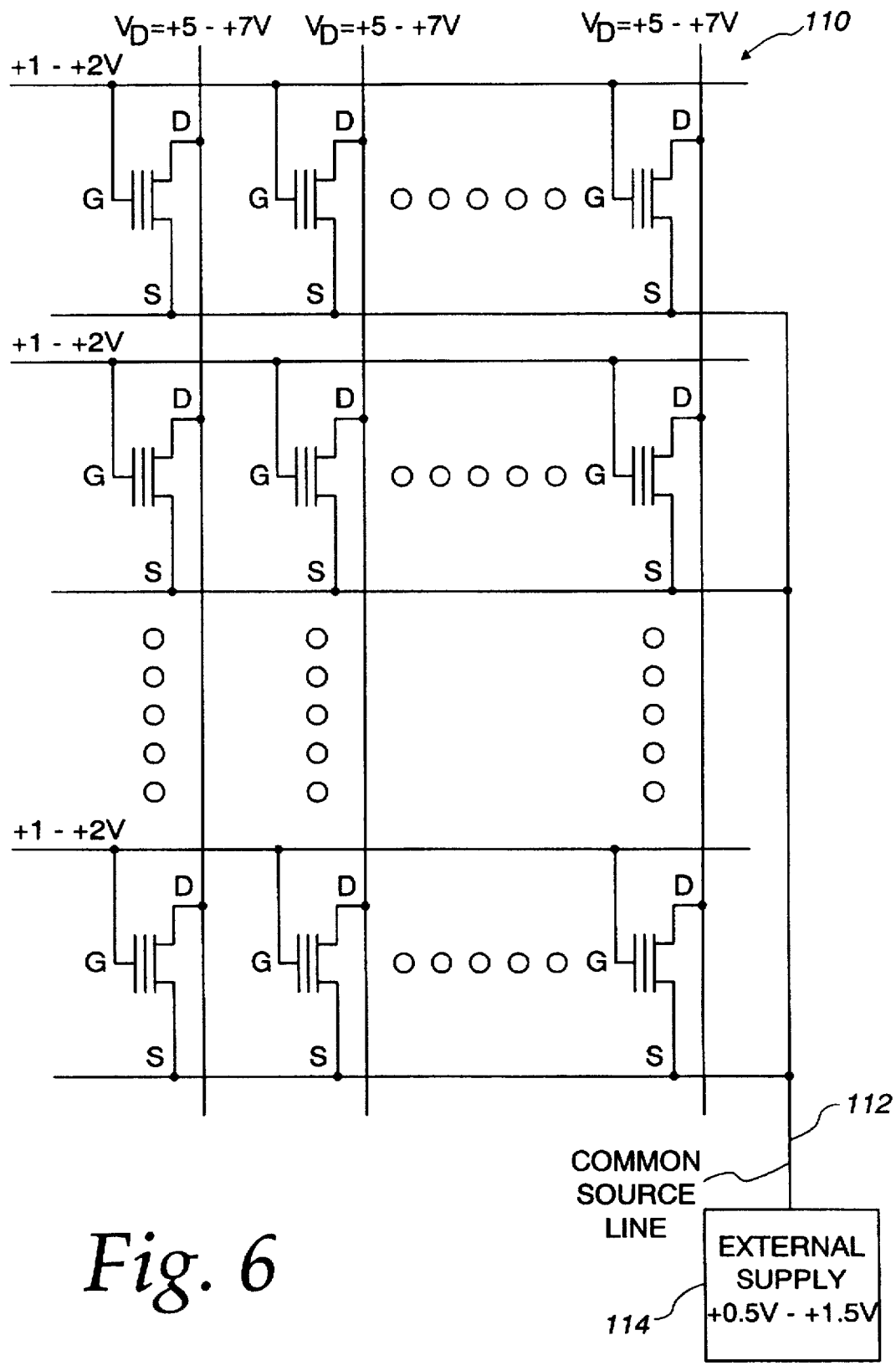
FIG. 6 is a schematic circuit diagram of a conventional NOR memory architecture 110 which employs the preprogramming step in accordance with the present invention.

In FIG. 6, there is shown such a conventional NOR memory architecture 110. In order to beneficially apply the pre-programming step to the conventional NOR memory architecture for improving the soft programming during automatic programming disturb (APD), a low voltage 114 such as +0.5−+1.5 volts is applied simultaneously to the common source line 112. As used herein, the term "automatic program disturb" refers to soft programming of the unselected cell during programming of the other cells on the same bit line. In other words, during the preprogramming step the low source voltage applied to all of the sources connected to common source line is performed during the same time when a low gate voltage of +1–2 volts is applied to all of the gates of the memory cells in the sector. As a result, the over-erased cells in the sector will be programmed back faster due to the positive gate voltage of +1-2 volts being applied.

As should be understood to those skilled in the art, it is only the unselected over-erased cells (i.e., those cells with a negative threshold voltage $V_t$) connected in the same column as the selected memory cells to be programmed that will cause a leakage current to occur. In other words, the unselected memory cells with a positive threshold voltage will not cause leakage current. Therefore, due to the back bias on the source the leakage current from the majority of the unselected memory cells connected to the selected column of bit lines during the programming operation will be reduced.

Referring back to FIG. 1, the novel programming operation of the NOR memory architecture 10 will now be explained. Initially, it is assumed that all of the bit lines BL1 through BLm have been precharged to the voltage $V'_s$. Further, it is assumed that the transistor $Q_{43}$ in the memory cell MC43 defining the selected cell is desired to be programmed. The other memory cells in the sector array 12 are referred to as the unselected memory cells. The gate G of the selected memory cell transistor $Q_{43}$ is connected to the word line WL4 defining the selected word line. The other remaining word lines are referred to as the unselected word lines. Further, the source S of the selected memory cell transistor Q43 is connected to the bit line BL3 defining the selected bit line. The other remaining bit lines are referred to as the unselected bit lines. The drain D of the transistor $Q_{43}$ as well as all of the drains of the other unselected memory cells are connected to the line 100 via the common array ground line VSS.

It is further assumed that the transistor $Q_{32}$ in the memory cell MC32 has been previously programmed defining an unselected programmed cell and that the transistor $Q_{33}$ in the memory cell MC33 has been previously erased defining an unselected erased cell. The gate of the transistor $Q_{32}$ is connected to the word line WL2 and the gate of the transistor $Q_{33}$ is connected to the word line WL3. The sources of the transistors $Q_{32}$ and $Q_{33}$ are also connected to the bit line BL3, and the drains thereof are connected to the line 100 via the common array ground line VSS.

The improved programming method used for multiple bits-per-cell Flash memory cells for performing channel hot-carrier programming in a NOR memory architecture in accordance with the principles of the present invention is accomplished by connecting a current source $I_s$ to the selected bit line BL3 containing the selected memory cell MC43 desired to be programmed. In other words, only the current source connected to the selected bit line is turned on. All of the unselected bit lines remain connected to the voltage $V'_s$. Simultaneously, there is applied a programming gate voltage $V_{g,prog}$ of approximately +7 V to the selected word line WL4 containing the selected memory cell MC43. Further, there is applied simultaneously a programming drain voltage $V_{dprog}$ of approximately +6–7 V to the line 100 connected to the common array ground line VSS. Thus far, the programming operation is identical to that described in the aforementioned co-pending application Ser. No. 08/635,995.

Unlike the prior art of applying zero volts to all of the unselected word lines, there is applied in the present programming method a relatively low gate voltage $V_{g,unselected}$ on the order of approximately 1–2 volts being applied to all of the unselected word lines WL1–WL3 and WL4–WLn in order to eliminate the program disturb on the unselected memory cells during the programming operation. As a result, the improved programming scheme will eliminate program disturb on the unselected memory cells MC13–MC33 and MC53–MCn3 connected to the selected bit line BL3 (the same column containing the selected memory cell to be programmed) during the programming operation of the selected memory cell MC43. In this manner, it can be seen that in accordance with the teachings of this invention, the unselected memory cells, either previously programmed or erased, connected to the same bit line containing the selected memory cell to be programmed are prevented from being disturbed during the programming operation of the selected memory cell.

Optionally, in order to improve the programming efficiency of any over-erased cells when they are selected for programming, a pre-programming step may be applied to all of the memory cells in the array so as to initially program back the over-erased cells prior to the programming operation. This is achieved by applying the same relatively low gate voltage on the order of 1–2 volts to all of the control gates of the memory cells in the array.

From the foregoing detailed description, it can thus be seen that the present invention provides an improved programming method used for multiple bits-per-cell Flash memory cells for performing channel hot-carrier programming in a NOR memory architecture so as to eliminate program disturb during a programming operation. This is achieved by applying a programming gate voltage to the control gates of the selected memory cells and applying simultaneously a relatively low voltage to all of the control gates of the non-selected memory cells in the array which are not to be programmed during the program ming operation.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

I claim:

1. An improved programming method for performing channel hot-carrier programming in an array of multiple bits-per-cell Flash EEPROM memory cells in a NOR memory architecture so as to eliminate program disturb during a programming operation, said array having a plurality of memory cells arranged in rows of word lines and columns of bit lines interconnecting said rows of word lines, each of said memory cells including a floating gate transistor having its control gate connected to one of said rows of word lines, its source connected to one of said columns of bit lines, and its drain connected to a common array ground line, said method comprising the steps of:

connecting a programming current source to the source of selected memory cells that are to be programmed in the corresponding columns of bit lines;

applying a programming gate voltage to control gates of the selected memory cells;

applying a programming drain voltage to the common array ground line connected to the drains of all of the memory cells;

pre-programming all of the memory cells in the array so as to initially program back over-erased cells prior to the programming operation so as to improve the programming efficiency of the over-erased cells when they are selected for programming; and said pre-programming step including applying a second relatively low positive voltage to all of the control gates of the memory cells, said second relatively low voltage having a magnitude in the range of +1–+2 volts.

2. A method as claimed in claim 1, wherein said programming drain voltage has a has a magnitude in the range of +6–7 volts.

3. A method as claimed in claim 2, wherein said relatively low voltage has a magnitude in the range of +1–2 volts.

4. A method as claimed in claim 3, further comprising the step of pre-charging initially all of the columns of bit lines in the array to a predetermined potential prior to the programming operation.

5. A method as claimed in claim 4, wherein said predetermined potential is equal to approximately the programming drain voltage.

6. A programming method for performing channel hot-carrier programming in a NOR memory architecture, said method comprising the steps of:

providing a memory array having a plurality of multiple bits-per-cell memory cells arranged in rows of word lines and columns of bit lines interconnecting said rows of word lines;

applying a programming gate voltage to control gates of selected memory cells;

applying simultaneously a relatively low voltage to all of the control gates of non-selected memory cells in the array which are not to be programmed during the programming operation so as to eliminate program disturb;

each of said memory cells including a floating gate transistor having its control gate connected to one of said rows of word lines, its source connected to one of said columns of bit lines, and its drain connected to a common array around line;

said programming gate voltage having a magnitude of approximately +7 volts; and said relatively low voltage having a magnitude in the range of +1–+2 volts.

7. A method as claimed in claim 6, further comprising the step of pre-charging initially all of the columns of bit lines in the array to a predetermined potential prior to the programming operation.

8. A method as claimed in claim 7, wherein said predetermined potential is equal to approximately the programming drain voltage.

9. A method for initially programming back over-erased cells in a NOR memory architecture prior to a programming operation, said method comprising the steps of:

providing a memory array having a plurality of memory cells arranged in rows of word lines and columns of bit lines intersecting said rows of word lines, each of said memory cells including a floating gate transistor having its control gate connected to one of said rows of word lines, its drain connected to one of said columns of bit lines, and its source connected to a common source line;

applying a first relatively low positive voltage to all of the control gates of the memory cells;

applying simultaneously a second relatively low voltage to all of the sources connected to the common source line and said first relatively low voltage having a magnitude in the range of +1–+2 volts and said second relatively low voltage having a magnitude in the range of +0.5–+1.5 volts.

10. A programming method for performing channel hot carrier programming in a NOR memory architecture, said method comprising the steps of:

providing a memory array having a plurality of multiple bits-per-cell memory cells arranged in rows of word lines and columns of bit lines interconnecting said rows of word lines;

applying a programming gate voltage to control gates of selected memory cells;

applying simultaneously a relatively low voltage to all of the control gates of non-selected memory cells in the array which are not to be programmed during the programming operation so as to eliminate program disturb;

pre-programming all of the memory cells in the array so as to initially program back over-erased cells prior to the programming operation so as to improve the programming efficiency of the over-erased cells when they are selected for programming;

said pre-programming step including applying a second relatively low positive voltage to all of the control gates of the memory cells; and said second relatively low voltage having a magnitude in the range of +1–+2 volts.

* * * * *

UNITED STATES PATENT AND TRADEMARK OFFICE
CERTIFICATE OF CORRECTION

PATENT NO. :     5,790,456
DATED       :     August 4, 1998
INVENTOR(S) :    Sameer S. Haddad It is certified that error appears in the above-indentified patent and that said Letters Patent is hereby corrected as shown below:

Column 2, line 3, change "hotelectron" to

-- hot-electron --;

Column 2, line 31, change "VT" to -- $V_T$ --.

Signed and Sealed this

Twentieth Day of October, 1998

*Attest:*

BRUCE LEHMAN

*Attesting Officer*     *Commissioner of Patents and Trademarks*